United States Patent [19]
Park et al.

[11] Patent Number: 5,880,616
[45] Date of Patent: Mar. 9, 1999

[54] DIGITAL LOGIC LEVEL CONVERSION CIRCUIT WITH A SMALL SINUSODAL WAVE INPUT

[75] Inventors: Moon Yang Park, Taejon; Ook Kim, Seoul; Jong Ryul Lee, Taejon, all of Rep. of Korea

[73] Assignee: Electronics and Telecommunications Research Institute, Taejon, Rep. of Korea

[21] Appl. No.: 769,808

[22] Filed: Dec. 18, 1996

[30] Foreign Application Priority Data

Dec. 18, 1995 [KR] Rep. of Korea ................... 1995 51462

[51] Int. Cl.[6] ....................................................... H03L 5/00
[52] U.S. Cl. ........................... 327/333; 327/166; 327/206; 327/299
[58] Field of Search ...................... 327/165, 166, 327/175, 205, 206, 291, 299, 333, 536, 538, 540, 541, 543; 326/62

[56] References Cited

U.S. PATENT DOCUMENTS 5,023,562  6/1991  Gumussoy .............................. 327/165
5,117,124  5/1992  Dicke ...................................... 327/212
5,514,981  5/1996  Tam et al. ............................... 327/166

*Primary Examiner*—Kenneth B. Wells
*Attorney, Agent, or Firm*—Jacobson, Price, Holman & Stern, PLLC

[57] ABSTRACT

The digital logic level conversion circuit is for converting a small sinusoidal signal or an unbalanced digital signal to a balanced digital signal with 50% duty ratio, and includes an input level shift circuit, two differential amplifiers, an RS flip-flop, a charge-pump circuit, and a bias circuit. The input level shift circuit for AC coupling a sinusoidal wave with a small amplitude (with a minimum of 0.4 Vpp) and converting it into a middle logic level. The two differential amplifiers is used as comparators having hysteresis each other, operates inversely, and outputs digital signals into the RS flip-flop; the bias circuit for controlling a driving current of the differential amplifiers; the RS flip-flop for driving the charge-pump circuit by outputting a digital signal upon receiving outputs from the differential amplifiers; and the charge-pump circuit for generating a reference potential level of the differential amplifiers.

5 Claims, 5 Drawing Sheets

DIGITAL LOGIC LEVEL CONVERSION CIRCUIT WITH A SMALL SINUSODAL WAVE INPUT

BACKGROUND OF THE INVENTION

1. Field of the Invention

This invention relates to a digital logic, level conversion circuit, and more particularly a digital logic level conversion circuit with a small sinusoidal wave input for converting a level of signal in order to use a sinusoidal wave with a small amplitude of several hundreds mV as a source of clock of an internal digital circuit.

2. Description of the Prior Art

Typically, a majority of circuit of late is possible to be integrated highly and has been replaced with an economical and reliable digital logic circuit. This trend is matched to customer's taste. In other words, a purchase desire of general customer can be raised through a miniature of size and a lightness of weight.

Therefore, a single chip of a high degree of integration has a remarkable tendency to incorporate a variety of function compoundly.

As a result, a circuit for converting a sinusoidal input with a small amplitude into a digital level can be designed very variously. For example, there is a method to amplify a signal with a small amplitude using an amplifier and then increase a noise margin by use of a schmitt trigger circuit and other circuits. In the method, however, a center potential is changed due to a perturbation of an offset potential when an outputted digital signal is amplified and the variation of a duty ratio of a source of digital clock outputted by hysteresis of a locked schmitt trigger circuit is very large.

Using this digital signal in general as a source of clock of a circuit causes a problem. Particulary, the clock used in a comparator such as a mixer circuit or an analog to digital (A/D) converter must be a clock with a duty ratio of just 50%.

In view of the foregoing problem, it is therfore an object of this invention to provide a signal conversion circuit which generates successively a digital signal with a duty ratio of just 50% and is not susceptible to a variation of semiconductor process, in other words, a digital logic level conversion circuit with a small sinusoidal input, as a circuit for converting a level of signal to use a sinusoidal wave with a small amplitude of several hundreds mV as a source of clock of an internal digital circuit, which allows the generated digital output to have an exact duty ratio of 50%.

SUMMARY OF THE INVENTION

For the purpose of accomplishing the object, according to this invention, a digital logic level conversion circuit with a small sinusoidal input comprises an input level shift circuit for AC coupling a sinusoidal wave with a small amplitude (with a minimum of 0.4 $V_{P-P}$) and converting it into a middle logic level; a first and a second differential amplifiers for operating inversely for one another to have hysteresis; a bias circuit for controlling a driving current of the first and second differential amplifiers; and RS filp-flop for driving a charge-pump circuit by outputting a low/high digital signal upon receiving outputs from the first and second differential amplifiers; and a charge-pump circuit for generating a reference potential level of the first and second differential amplifiers.

BRIEF DESCRIPTION OF THE DRAWINGS

The present invention will be more clearly understand from the following description by way of the preferred embodiment with reference to the accompanying drawings, wherein.

DETAILED DESCRIPTION OF THE PREFERRED EMBODIMENT

Hereinafter, the present invention will be explained by way of an embodiment with reference to the accompanying drawings.

Figure 1:
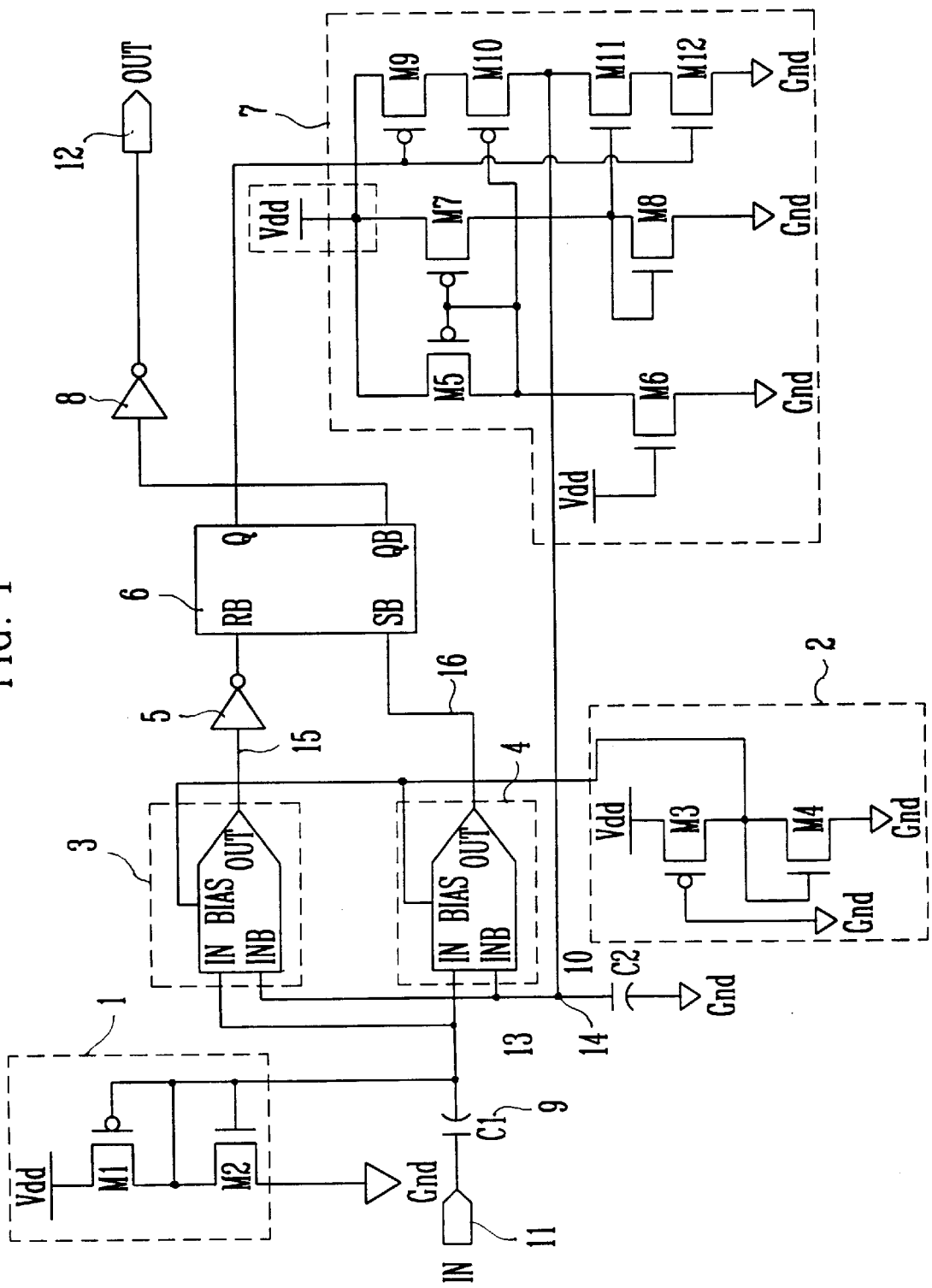
FIG. 1 is a digital logic level conversion circuit of this invention.

FIG. 1 shows a digital logic level conversion circuit of this invention which is composed of an input level shift circuit 1 for converting a sinusoidal wave with a small amplitude into a middle logic level, a second and a first differential amplifiers 3 and 4 having hysteresis for increasing a noise margin, a bias circuit 2 for controlling a driving current of the first and second differential amplifiers 3 and 4, an RS flip-flop 6 for driving a charge-pump circuit upon receiving an output from the first and second differential amplifiers 3 and 4, and a charge-pump circuit 7 for generating a reference potential of the first and second differential amplifiers 3 and 4.

Looking into the operation of the digital logic level conversion circuit of this invention constructed above, when a sinusoidal wave with a small amplitude is inputted through a first capacitor (C1; 9) from an input 11, potential of this sinusoidal wave is raised to 2.5 V potential at a middle point of digital level by the input level shift circuit 1 composed of a first p-type MOS (PMOS) transistor M1 and a first n-type MOS (NMOS) transistor M2 This time, the first PMOS transistor and the first NMOS transistor M1 and M2 are operated as diodes.

In order that the input level shift circuit 1 correctly adjusts a logic level to the center of it, dimension ratios of the PMOS transistor M1 and the NMOS transistor M2 should be designed by means of simulation. However, in this circuit, the gates and drains of both transistor M1, M2 are all connected together. This results in both transistor M1, M2 being biased on, and thereby effectively operating as a voltage divider between Vdd and Gnd. The level-shifted sinusoidal signal is inputted to the second and the first positive differential amplifiers 3 and 4.

Figure 2:
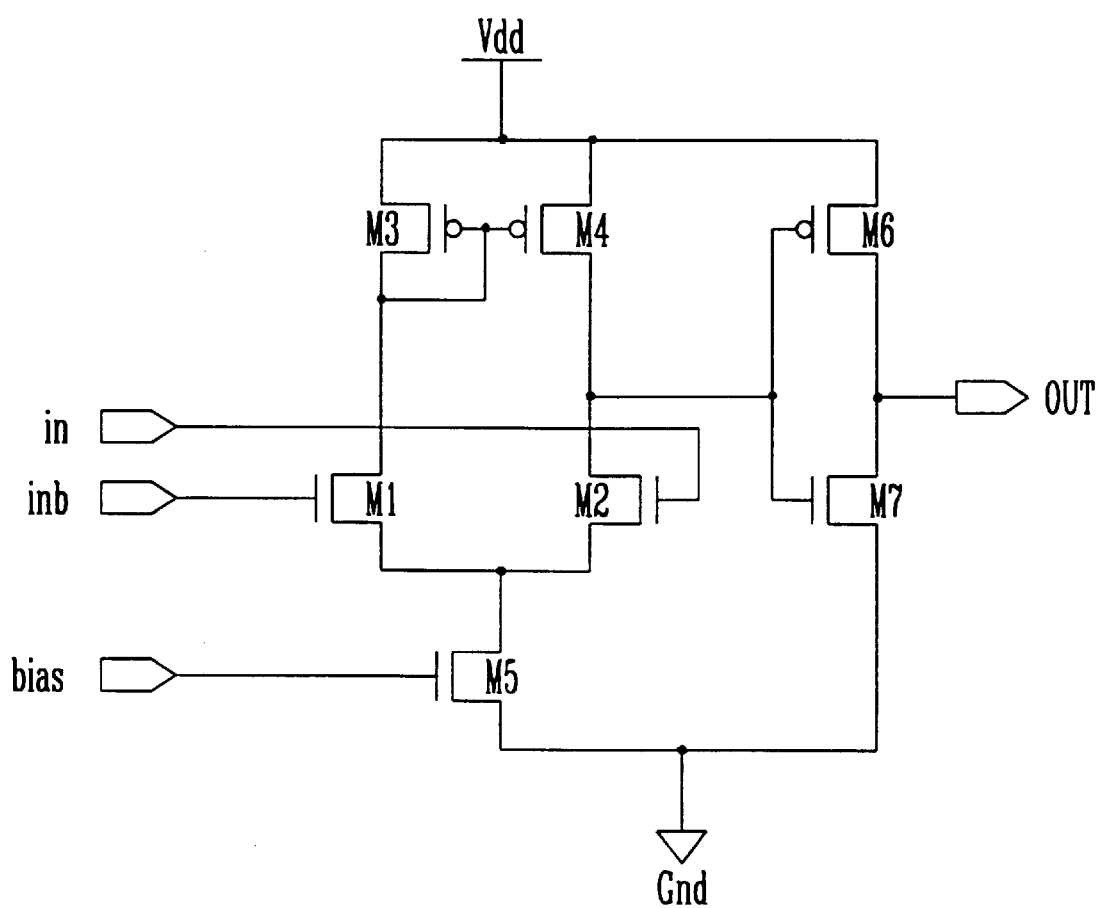
FIG. 2 is a detailed circuit diagram of a first and a second differential amplifiers in FIG. 1.
Figure 3:
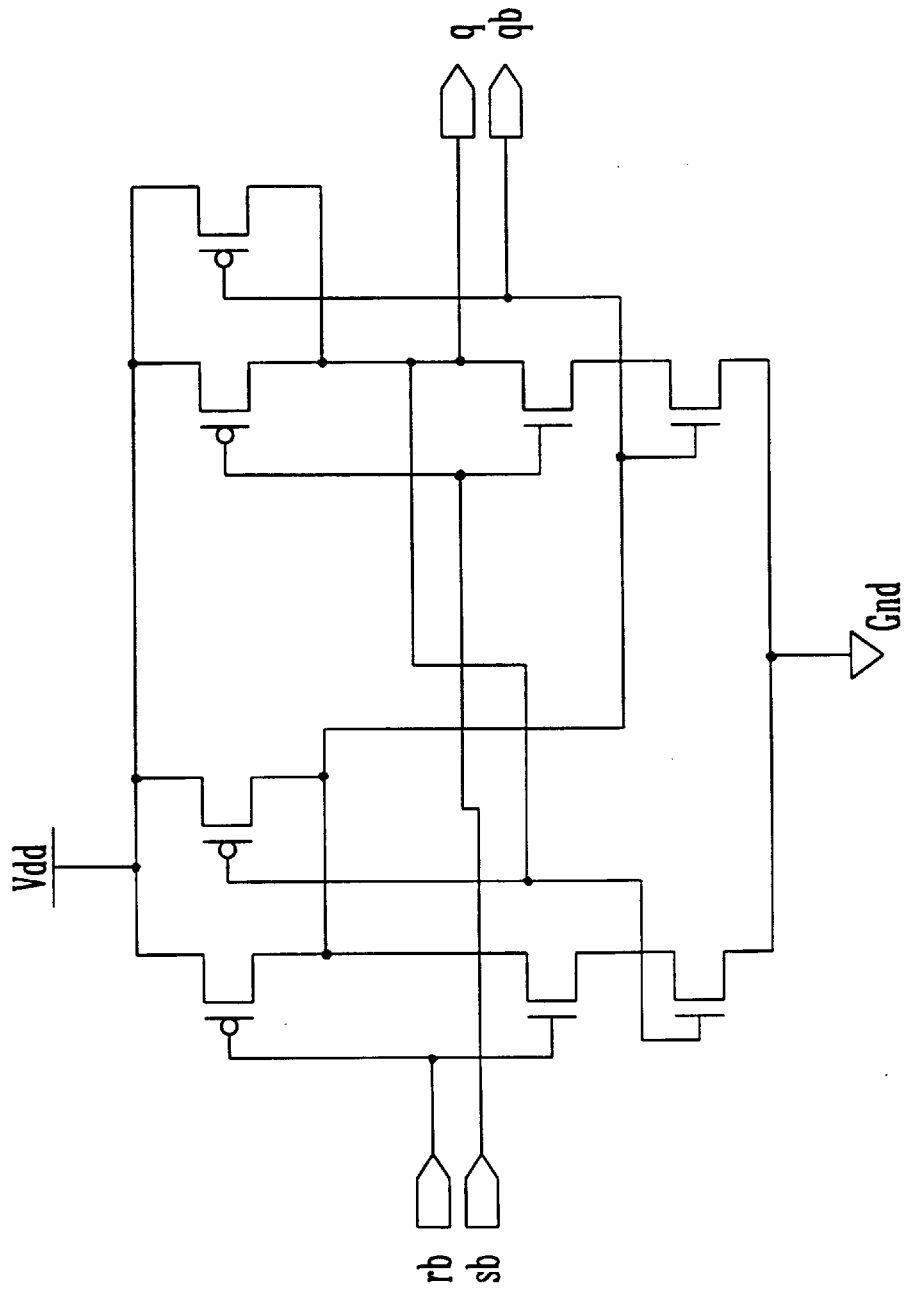
FIG. 3 is a detailed diagram of an RS flip-flop circuit in FIG. 1.

Referring to FIG. 2, a detailed circuit diagram of the first and second differential amplifiers 3 and 4 is shown. In FIG. 1, an operating current of the first and second differential amplifiers 3 and 4 are determined by a bias circuit 2 composed of a second PMOS transistor M3 and a second NMOS transistor M4.

Here, a capacitor 10 C2 connected to the reference potential has the function of filtering an output of the charge-pump circuit 7 and performs the function to determine a responce speed.

In designed the first and the second differential amplifiers 3 and 4, INB ports of the first and second differential amplifiers 3 and 4 are connected to the reference potential and a signal is inputted externally to IN ports of them connected to an input coupled capacitor.

As shown in FIG. 2, the first and second differential amplifiers 3 and 4 comprises third, fourth, and sixth PMOS transistors M3, M4 and M6 receiving in parallel a preset positive voltage (e.g. 5 volts d.c.) in their source ports, a second NMOS transistor M2 in which its gate port receives an input signal converted through the input level shift circuit, its drain port connected to a drain port of the fourth PMOS transistor M4 and a gate port of the sixth PMOS transistor M6, a first NMOS transistor M1 in which its gate port receives a reference voltage generated in the charge pump circuit 7, its drain port connected to a drain port of the third PMOS transistor M3 and a common gate port of the third and fourth PMOS transistors M3 and M4 and its source port connected in common to a source port of the second NMOS transistor M2, a fifth NMOS transistor M5 in which its drain port is connected to a common source port of the first and second NMOS transistors M1 and M2, its gate port receiving an output signal of the bias circuit 2, and a seventh NMOS transistor M7 having its gate port receiving a voltage cross the gate port of the sixth PMOS transistor M6 and the drain port of the second NMOS transistor M2.

For the first and second differential amplifiers 3 and 4, transistor channels of NMOS transistor M1 and NMOS transistor M2 are designed to be same in length and different in width to thereby have hysteresis by the increase in a noise margin. In addition, the channel width of transistor on a reference potential side is designed to be narrower in case of the second differential amplifier 4 and the channel width of transistor connected to the reference potential is designed to be wider in case of the first differential amplifier 3.

As a result, the two amplifiers 3 and 4 are operated to generate hysteresis, resulting in the increase in the noise margin. A correct operating waveform for this is shown is FIG. 5.

Maximum outputs of the first and second differential amplifiers 3 and 4 are changed in range from $V_{dd}$ e.g. (5 volts d.c.) to $G_{nd}$ (e.g. 0 volts d.c.). Between the outputs, an output of the first differential amplifier 3 is inverted and inputted to an RB port of an RS flip flop 6 and an output of the second differential amplifier 4 is inputted to an SB port of the RS flip-flop 6 and outputted as a complete digital signal.

Figure 5:
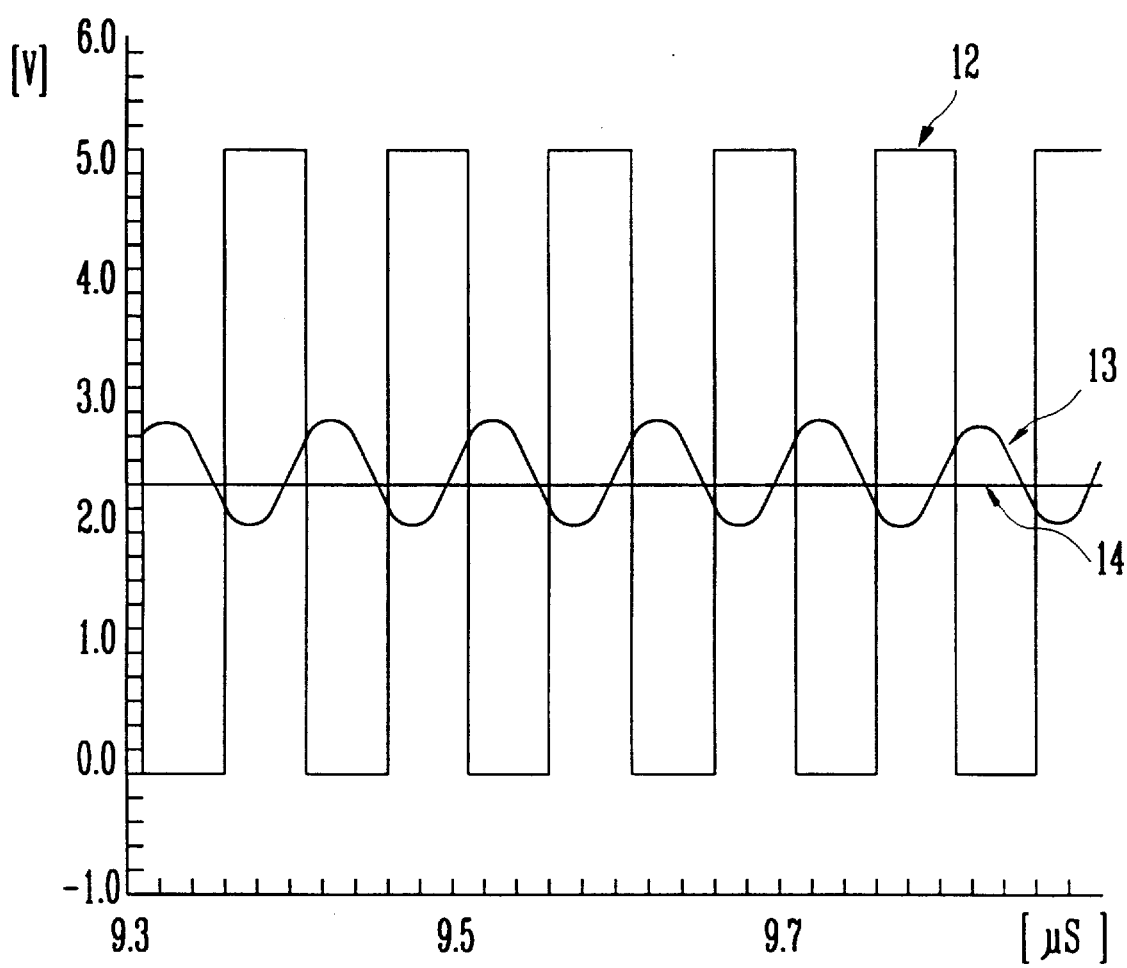
FIG. 5 is an operating waveform at a front stage of an RS flip-flop circuit in FIG. 1.

When the output of the second differential amplifier 4 to be inputted to the SB port of the RS flip-flop 6 is changed from high level to low level, the QB output of the RS flip-flop 6 is changed, and when the output of the first differential amplifier 3 is changed from low level to high level, the output is inverted and the inputted to the RB port of the RS flip-flop 6 to thereby change the QB output. An operational waveform at this time is shown in FIG. 5.

A Q output of the RS flip-flop 6 is inputted to control ports PMOS transistor M9 and NMOS transistor M12 of the charge-pump circuit 7. Gate potential of PMOS transistor M10 and NMOS transistor M11 determines current through PMOS transistor M5 by way of NMOS transistor M6 as a transistor in place of a resistor. This current allows same current to flow through PMOS transistor M7 by a current mirror.

In the above state, a drain potential of PMOS transistor M5 is inputted to a gate port of PMOS transistor M10 and a drain potential of NMOS transistor M8 is inputted to a gate port of NMOS transistor M11. The thus-set potential buffers directly PMOS transistors M9 and M10 and an upper stage operated by a signal inputted from the RS flip-flop 6.

An inputted control signal changes a reference potential to be inputted to the first and the second differential amplifiers 3 and 4, in accordance to maintenence time of low and high logic levels. When state of high level in the Q output of the RS flip-flop 6 is long, the reference potential is moved towards $V_{dd}$, while, when state of low level in the Q output of the RS flip-flop 6 is long, the reference potential is moved towards $G_{nd}$.

Finally, when maintenance time of low level is equal to that of high level, in other words, when a duty ratio is 50%, the output of the charge-pump circuit 7, that is i.e, the reference potential of the first and second differential amplifiers 3 and 4 are maintained as an exact middle potential of the sinusoidal input.

Figure 4:
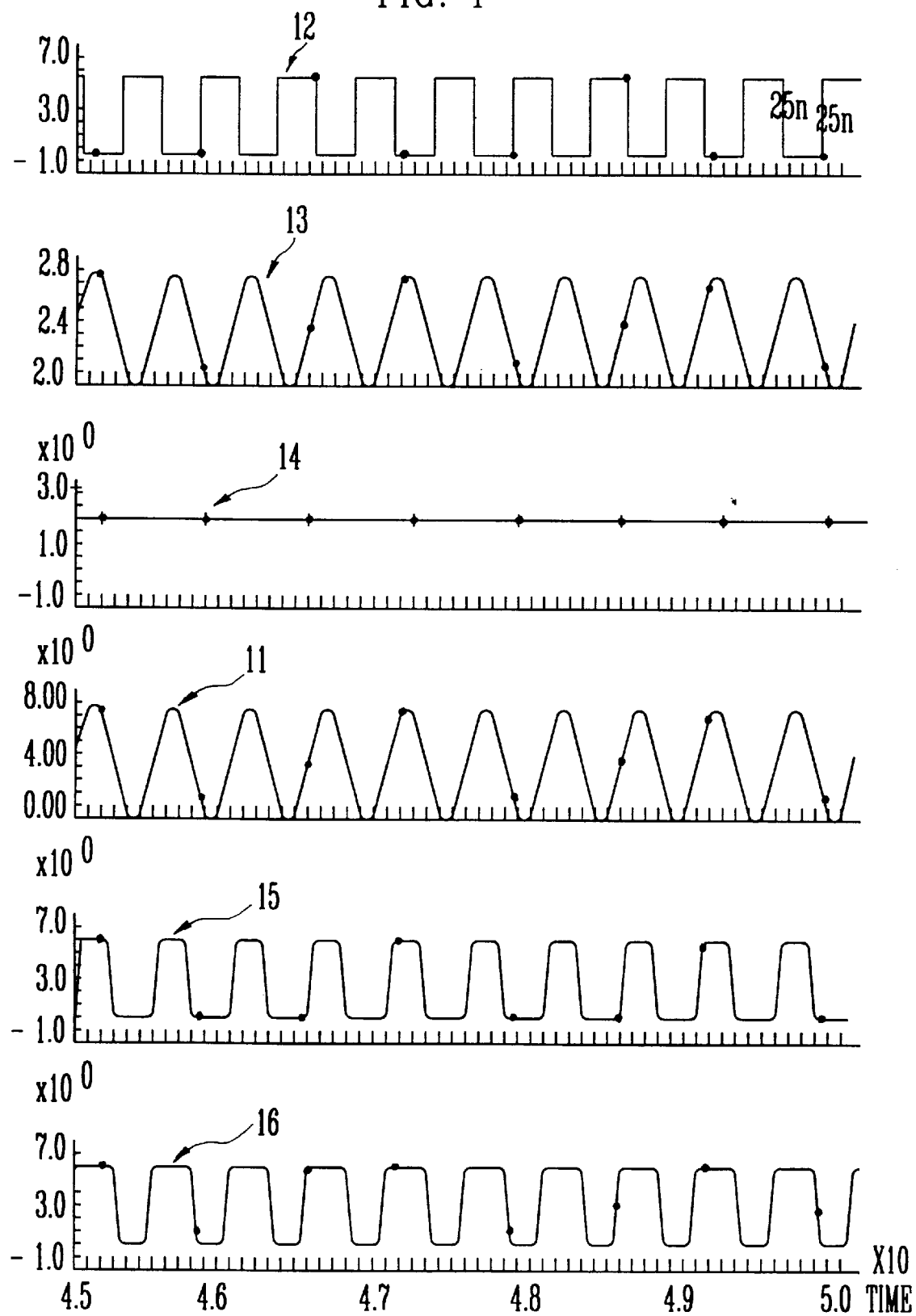
FIG. 4 is an operating waveform of FIG. 1.

This reference potential performs repeatedly the operation following according to the sinusoidal input so that an output clock 12 is outputted as a source of clock with a duty ratio of just 50%. The output at this time is outputted to the QB port of the RS flip-flop 6. Also, an inverting buffer 8 is provided for driving an external circuit. An entire operating waveform is shown in FIG. 4.

As is apparent from the above detailed description, this invention has an effect that it is applicable to a source of clock of a comparator in a communication related circuit by use of a circuit in which a sinusoidal input with several hundreds mV (with a minimum of 0.4 $V_{P-P}$) is converted into a digital logic level 0 Volt–5 Volt and a reference voltage follows the sinusoidal input such that a duty ratio of the converted digital logic level can be generated as a complete pulse waveform within 50% ⊥ 5.

What is claimed is:

1. A digital logic level conversion circuit with a small sinusoidal wave input for converting a level of small sinusoidal signal, said digital logic level conversion circuit comprising:

a first capacitor;

an input level shift circuit for shifting a voltage level of the small sinusoidal wave input inputted through said capacitor;

a first differential amplifier having a positive threshold voltage which receives the output of said input level shift circuit, said first differential amplifier having hysteresis;

a second differential amplifier having a negative threshold voltage which receives the output of said input level shift circuit, said second differential amplifier having hysteresis;

a bias circuit for controlling driving currents of said first differential amplifier and said second differential amplifier;

an RS flip-flop operated according to output signals of said first differential amplifier and said second differential amplifier; and a charge-pump circuit operated according to an output signal of said RS flip-flop and outputting a digital signal to said first differential amplifier and said second differential amplifier.

2. The digital logic level conversion circuit as set forth in claim 1, wherein said first and said second differential amplifiers comprise:

first, second and third p-type MOS transistors M3, M4 and M6 receiving a predetermined positive voltage at their source ports;

a fourth n-type MOS transistor M2 with its gate port receiving a signal converted by means of said input level shift circuit, and its drain port connected to a drain port of the second p-type MOS transistor M4 and a gate port of the third p-type MOS transistor M6;

a fifth n-type MOS transistor M1 with its gate port receiving a reference voltage generated from said charge-pump circuit, its drain port connected to a drain port of said first p-type MOS transistor M3 and a common gate port of said first and second p-type MOS transistors M3 and M4, and its source port connected in common to a source port of said sixth n-type MOS transistor M2;

a seventh n-type MOS transistor M5 with its drain port connected to a common source port of said fifth and fourth n-type MOS transistors M1 and M2 and its gate port receiving an output signal of said bias circuit; and a seventh n-type MOS transistor M7 having its gate port receiving a voltage cross said gate port of said third p-type MOS transistor M6 and said drain port of said fourth n-type MOS transistor M2.

3. The digital logic level conversion circuit as set forth in claim 2, wherein channels of said fourth and fifth n-type MOS transistors M2 and M1 are designed to be same in length and different in width.

4. The digital logic level conversion circuit as set forth in claim 2, wherein a channel width of the fifth transistor M1 receiving a reference voltage at its gate is narrower than that of the fourth transistor M2 in the first differential amplifier, and a channel width of the fifth transistor M1 receiving the reference voltage at its gate is wider than that of the fourth transistor M2 in the second differential amplifier.

5. The digital logic level conversion circuit as set forth in claim 1, wherein the output of said first differential amplifier is inverted and then coupled to RB port of said RS flip-flop, the output of said second differential amplifier is coupled to SB port of said RS flip-flop, Q output of said RS flip-flop is connected to gates of an eighth p-type MOS transistor M9 and a ninth n-type MOS transistor M12 in said charge pump circuit, the output of said charge-pump circuit which is a drain of a tenth p-type MOS transistor M10 is connected to INB ports of said first and said second differential amplifiers, and a second capacitor is provided between Gnd and drain of said tenth p-type MOS transistor M10.

* * * * *